(12) United States Patent
Hafez et al.

(10) Patent No.: US 8,829,592 B2
(45) Date of Patent: Sep. 9, 2014

(54) NON-VOLATILE STORAGE ELEMENT HAVING DUAL WORK-FUNCTION ELECTRODES

(75) Inventors: Walid M. Hafez, Portland, OR (US); Anisur Rahman, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 12/967,436

(22) Filed: Dec. 14, 2010

(65) Prior Publication Data
US 2012/0146124 A1    Jun. 14, 2012

(51) Int. Cl.
*H01L 29/788* (2006.01)
*H01L 29/423* (2006.01)
*G11C 16/04* (2006.01)
*H01L 29/792* (2006.01)
*H01L 49/02* (2006.01)
*H01L 29/51* (2006.01)
*H01L 21/28* (2006.01)

(52) U.S. Cl.
CPC .......... *H01L 29/792* (2013.01); *H01L 29/4234* (2013.01); *G11C 16/0466* (2013.01); *H01L 28/40* (2013.01); *H01L 29/513* (2013.01); *H01L 21/28282* (2013.01)
USPC ................. 257/321; 257/E21.209; 257/E29.3; 438/594

(58) Field of Classification Search
CPC . H01L 45/00; H01L 29/7311; H01L 29/7606; H01L 29/82; H01L 33/0004; H01L 39/22; H01L 21/28273; H01L 29/122; H01L 29/66462; H01L 29/66825; H01L 27/2418; H01L 29/66833; H01L 29/792; H01L 31/03
USPC .......... 257/324, E29.309, 314–316, E29.179, 257/E29.241, E29.323, E39.012, E45.001, 257/E27.129, 30, 425, 24, 438, E21.41, 257/E21.423, E21.46, E29.245; 438/268, 438/285
See application file for complete search history.

(56) References Cited

U.S. PATENT DOCUMENTS

| | | | |
|---|---|---|---|
| 6,903,407 B1 | 6/2005 | Kang | |
| 7,105,852 B2 * | 9/2006 | Moddel et al. | 257/30 |
| 7,187,587 B2 * | 3/2007 | Forbes | 365/185.23 |
| 7,208,802 B2 * | 4/2007 | Shimizu et al. | 257/405 |

(Continued)

OTHER PUBLICATIONS

International Searching Authority, "Notification of Transmittal of the International Search Report and the Written Opinion of the International Searching Authority," mailed May 22, 2012, in International application No. PCT/US2011/062254.

*Primary Examiner* — Stephen W Smoot
*Assistant Examiner* — Edward Chin
(74) *Attorney, Agent, or Firm* — Trop, Pruner & Hu, P.C.

(57) ABSTRACT

A non-volatile storage element and a method of forming the storage element. The non-volatile storage element comprises: a first electrode including a first material having a first work function; a second electrode including a second material having a second work function higher than the first work function; a first dielectric disposed between the first electrode and the second electrode, the first dielectric having a first bandgap; a second dielectric disposed between the first dielectric and the second electrode, the second dielectric having a second bandgap wider than the first bandgap and being disposed such that a quantum well is created in the first dielectric; and a third dielectric disposed between the first electrode and the first dielectric, the third dielectric being thinner than the second dielectric and having a third bandgap wider than the first bandgap.

15 Claims, 4 Drawing Sheets

(56) References Cited

U.S. PATENT DOCUMENTS

| | | | |
|---|---|---|---|
| 7,750,394 B2 * | 7/2010 | Shimizu et al. | 257/316 |
| 7,897,453 B2 * | 3/2011 | Chen et al. | 438/237 |
| 7,995,371 B2 * | 8/2011 | Rinerson et al. | 365/148 |
| 8,129,243 B2 * | 3/2012 | Bhattacharyya | 438/263 |
| 8,319,274 B2 * | 11/2012 | Hisamoto et al. | 257/324 |
| 2008/0217677 A1 | 9/2008 | Jeon et al. | |
| 2009/0014781 A1 | 1/2009 | Baik et al. | |
| 2009/0273018 A1 | 11/2009 | Cho et al. | |
| 2010/0187545 A1 * | 7/2010 | Khan et al. | 257/79 |
| 2011/0155998 A1 * | 6/2011 | Koyama et al. | 257/13 |
| 2011/0193180 A1 * | 8/2011 | Chen et al. | 257/411 |
| 2011/0291067 A1 * | 12/2011 | Brewer et al. | 257/4 |
| 2011/0309430 A1 * | 12/2011 | Purayath et al. | 257/321 |
| 2012/0273869 A1 * | 11/2012 | Yasuda | 257/324 |

\* cited by examiner

NON-VOLATILE STORAGE ELEMENT HAVING DUAL WORK-FUNCTION ELECTRODES

FIELD

Embodiments of the invention relate to integrated circuit fabrication and, in particular, to non-volatile storage elements such as flash cells.

BACKGROUND

Non-volatile storage elements may include a dielectric barrier layer, typically made of silicon dioxide, sandwiched between two electrode layers, such as two metal layers or two layers of polysilicon. A voltage may be applied to a first electrode layer (typically a top electrode layer) of the two electrode layers to control write and erase operations. Specifically, when a voltage is applied to the first electrode layer, charges move past the barrier layer and into a second electrode by way of well known tunneling or hot carrier injection mechanisms.

Currently, storage elements that require long data retention in the off-state are constructed with thick barrier layers, typically in the order of 70 Angstroms, in order to prevent any stored charges from leaking. As a result, higher voltages may need to be applied to the first electrode layer as compared with a situation where the barrier layer was thinner. Conversely, to achieve a low voltage operation, the barrier layer may be thinned in order to allow easier charge injection into the second electrode. However, a thinner barrier layer may result in stored charges from leaking more easily through the barrier, reducing the lifetime of the storage element.

BRIEF DESCRIPTION OF THE DRAWINGS

Some embodiments of the invention may be better understood by referring to the following description and accompanying drawings that are used to illustrate embodiments of the invention. In the drawings.

DETAILED DESCRIPTION

In the following description, numerous specific details are set forth. However, it is understood that embodiments of the invention may be practiced without these specific details. In other instances, well-known circuits, structures and techniques have not been shown in detail in order not to obscure an understanding of this description.

In the following detailed description, reference is made to the accompanying drawings that show, by way of illustration, specific embodiments in which the claimed subject matter may be practiced. These embodiments are described in sufficient detail to enable those skilled in the art to practice the subject matter. It is to be understood that the various embodiments, although different, are not necessarily mutually exclusive. For example, a particular feature, structure, or characteristic described herein, in connection with one embodiment, may be implemented within other embodiments without departing from the spirit and scope of the claimed subject matter. In addition, it is to be understood that the location or arrangement of individual elements within each disclosed embodiment may be modified without departing from the spirit and scope of the claimed subject matter. The following detailed description is, therefore, not to be taken in a limiting sense, and the scope of the subject matter is defined only by the appended claims, appropriately interpreted, along with the full range of equivalents to which the appended claims are entitled. In the drawings, like numerals refer to the same or similar elements or functionality throughout the several views, and that elements depicted therein are not necessarily to scale with one another, rather individual elements may be enlarged or reduced in order to more easily comprehend the elements in the context of the present description.

Embodiments provide a non-volatile storage element having dual work-function electrodes and a method of forming the same. The storage element includes a first electrode including a first material having a first work function; a second electrode including a second material having a second work function higher than the first work function; a first dielectric disposed between the first electrode and the second electrode, the first dielectric having a first bandgap; and a second dielectric disposed between the first dielectric and the second electrode, the second dielectric having a second bandgap wider than the first bandgap and being disposed such that a quantum well is created in the first dielectric. According to some embodiments, the first dielectric provides a charge storage region, and the second dielectric provides a retaining barrier for the stored charges in a zero bias state and a write state of the storage element in order to prevent charge leakage. According to one embodiment, a third dielectric may be disposed between the first electrode and the first dielectric in order to serve as an injecting barrier for the electrons during a write operation.

Figure 1:
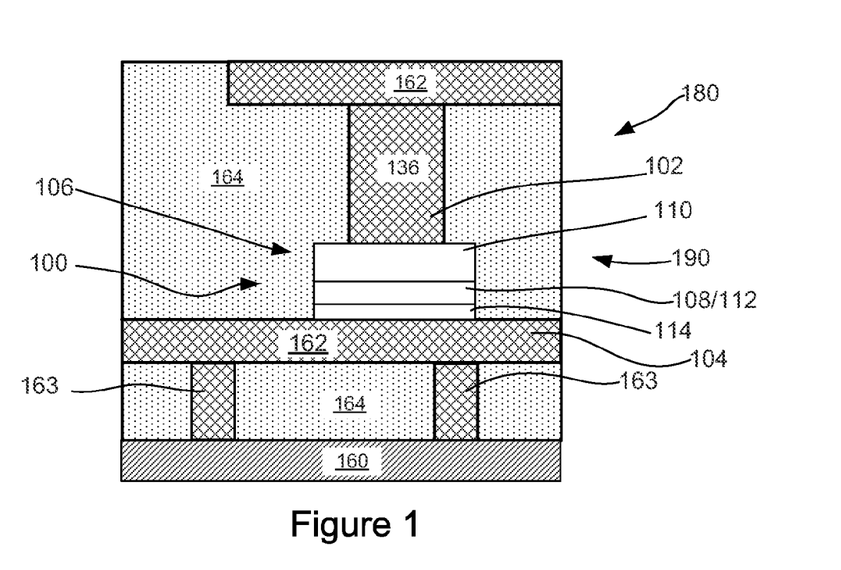
FIG. 1 is a cross-sectional view of a portion of an integrated circuit including a non-volatile storage element according to an embodiment.

Referring first to FIG. 1, a portion of an integrated circuit 180 is shown including an interconnection system 190, which in turn comprises a storage element 100 according to an embodiment. Interconnection system 190 includes a substrate 160 which may be a semiconductor material such as silicon, silicon germanium, and gallium arsenide. Above substrate 160 may be a stack including several interconnection layers 162 separated by respective layers of dielectric material 164 which may be for example include silicon dioxide, spin-on glass, polyimide, diamond-like carbon etc. The stack may for example be formed in a well known manner using a CMOS, PMOS, or NMOS back-end-of-line process, and each of the layers within the stack may include one or more layers. Vias 163 electrically connect a storage element 100 to the interconnect layers 162.

In particular, referring still to FIG. 1, storage element 100 includes a first electrode 104 (corresponding in this embodiment to shown via 163) including a first material having a first work function, and a second electrode 102 (corresponding in this embodiment to a shown interconnect layer 162) including a second material having a second work function higher than the first work function. For example, first electrode 104 and second electrode 102 may each comprise either a semiconductor material or a conductive material. The semiconductor material may include, by way of example, silicon, germanium, gallium arsenide, or gallium antimonide, and the conductive material may include, by way of example, a metal or a metal alloy such as aluminum, nickel, platinum, a nitride such as titanium or tantalum nitride, or copper. Regardless of the materials used for electrodes 102 and 104, the work function of the material of the second electrode 102 is higher than the work function of the material of the first electrode.

Sandwiched between the first electrode 104 and the second electrode 102 is a dielectric stack 106 including a first dielectric 108 disposed between the first electrode 104 and the second electrode 102, the first dielectric 108 having a first bandgap. Preferably the first dielectric includes a high-k material, that is, an oxide of a metal that has a dielectric constant (k) higher than the dielectric constant of silicon dioxide. For an embodiment, the high-k dielectric layer may include hafnium oxide. Other embodiments may include a high-k dielectric layer made from any materials capable of minimizing gate leakage such as, but not limited to, hafnium silicon oxide, lanthanum oxide, zirconium oxide, zirconium silicon oxide, titanium oxide, tantalum oxide, barium strontium titanium oxide, barium titanium oxide, strontium titanium oxide, yttrium oxide, aluminum oxide, lead scandium oxide, and lead zinc niobate.

The dielectric stack 106 additionally includes a second dielectric 110 disposed between the first dielectric 108 and the second electrode 102, the second dielectric 110 having a second bandgap wider than the first bandgap and being disposed such that a quantum well is created in the first dielectric. Preferably the second dielectric includes SiO2, to the extent that most high-k materials have a narrower bandgap than SiO2. Second dielectric 110 may be made of any dielectric material capable of insulating first dielectric 108 from second electrode 102 and presenting a conduction band discontinuity with the material of the first dielectric 108. For another embodiment, second dielectric may include silicon nitride or silicon oxynitride. The conduction band discontinuity between the first and second dielectrics creates a quantum well 112 for charges/electrons within the first dielectric.

Further shown in FIG. 1, as part of dielectric stack 106, a third dielectric 114 is provided. The third dielectric may include the same material as the material of the second dielectric, or a different material. A primary requirement with respect to the third dielectric is that it have a bandgap that is suitably larger than that of the quantum well storage dielectric. The third dielectric 114 may serve as a thin injecting barrier to facilitate electron injection into the quantum well 112. The second dielectric 110 may further serve as a thicker retaining barrier than the barrier layer provided by the third dielectric in order to minimize charge leakage loss during data retention.

The thicknesses of the various components of storage element 100 depends on the scaling requirements of the device technology so that the entire gate structure of the storage element permits induction of charges from the first dielectric through the third dielectric. The thicknesses of the various components also depends on the size of voltage applied to the first electrode. In general, the thickness of the injection barrier is limited by the need to be reliable through the desired number of read/write cycles. Having too thin of an injection oxide may result in premature breakdown or excessive SILC (stress induced leakage current) through the gate, degrading the cell performance. The retention barrier on the other hand must be sufficiently thick as to provide the required lifetime for charge storage in the quantum well.

Figure 2:
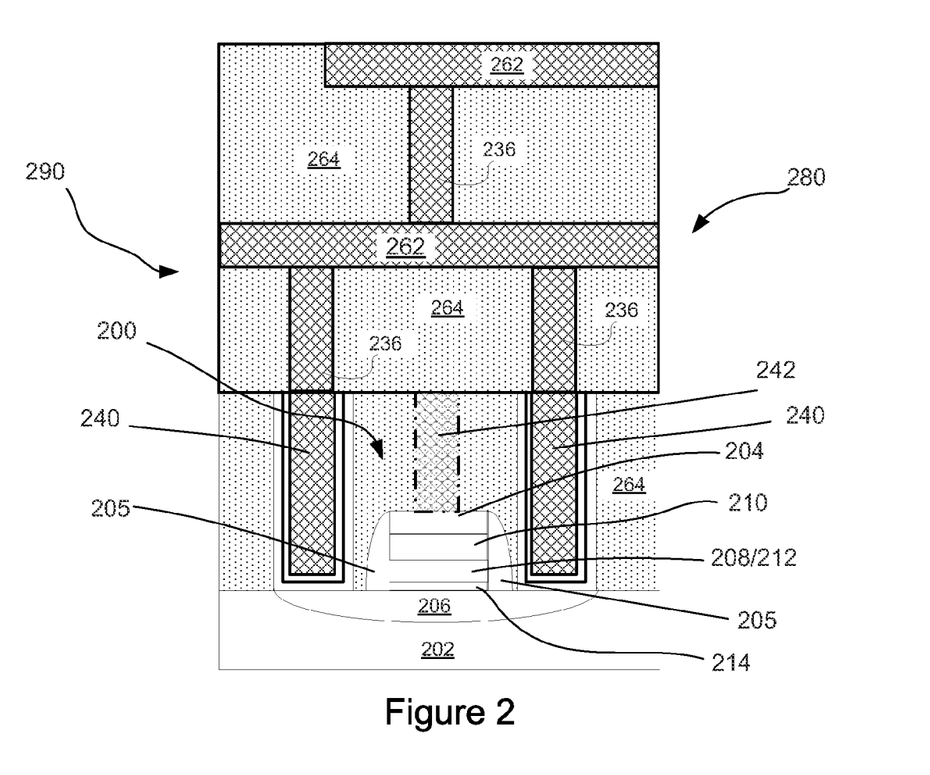
FIG. 2 is a cross-sectional view of a portion of an integrated circuit including a non-volatile storage element according to another embodiment.

Referring next to FIG. 2, another embodiment is shown of an integrated circuit incorporating a storage element. As seen in FIG. 2, a storage element according to one embodiment may take the form of a flash cell 200. Flash cell 200 as shown includes gate oxide layer 214 formed on an upper surface of semiconductor substrate 202. The gate oxide layer 214 serves as a third dielectric layer similar to third dielectric layer 114 of FIG. 1, and semiconductor substrate 202 serves as a first electrode similar to first electrode 104 of FIG. 1 and may comprise a semiconductor material such as for example, silicon, germanium, gallium arsenide, gallium antimonide or other materials suitable as foundation upon which flash cells are fabricated. Floating gate 208 is formed on gate oxide layer 214, and serves as a first dielectric layer similar to first dielectric layer 108 of FIG. 1. Thus, floating gate 208 may, according to an embodiment, include a high-k material, such as, for example, hafnium oxide, hafnium silicon oxide, lanthanum oxide, zirconium oxide, zirconium silicon oxide, titanium oxide, tantalum oxide, barium strontium titanium oxide, barium titanium oxide, strontium titanium oxide, yttrium oxide, aluminum oxide, lead scandium oxide, and lead zinc niobate. Gate oxide layer 214 insulates floating gate 208 from channel region 206, which can be of the same doping type as the source/drain (as shown) or of an opposite type (similar to a conventional MOSFET transistor). Tunnel dielectric layer 210 is formed on floating gate 208, and serves as a second dielectric layer similar to second dielectric layer 110 of FIG. 1. Preferably, as noted with respect to the second dielectric 110 and first dielectric 108 FIG. 1, tunnel dielectric layer 210 includes a material that presents a bandgap difference with the material of the floating gate 208. More preferably, if the floating gate 208 includes a high-k material, the second dielectric includes SiO2, to the extent that, most high-k materials will have a narrower bandgap than SiO2. The conduction band discontinuity between the first and second dielectrics, that is, with respect to the material of floating gate 208 and the material of the tunnel dielectric 210, creates a quantum well 212 for charges/electrons within the first dielectric.

Referring still to FIG. 2, control gate 204 is formed on tunnel dielectric layer 210, and serves as the second electrode similar to second electrode 102 of FIG. 1. The control gate may for example include a conductive material. The semiconductor material may include, by way of example, silicon, germanium, gallium arsenide, or gallium antimonide, and the conductive material may include, by way of example, a metal or a metal alloy such as aluminum, nickel, platinum, a nitride such as titanium or tantalum nitride, or copper. Regardless of the materials used for substrate 202 and control gate 204, the work function of the material of the control gate 204 is higher than the work function of the material of the substrate 202.

Control gate 204, tunnel dielectric 210, floating gate 208 and gate oxide 214 are interposed between sidewall spacers 205. A channel region 206, for example a doped channel region, may be formed as shown in semiconductor substrate 202.

The gate oxide layer 214, similar to third dielectric 114 of FIG. 1, may serve as a thin injecting barrier to facilitate electron injection into the floating gate 208. The tunnel dielectric 210, similar to second dielectric 110, may further serve as a thicker retaining barrier than the barrier layer provided by the gate oxide layer in order to minimize charge leakage loss during data retention. Gate oxide layer 214 may be made of any dielectric material capable of insulating floating gate 208 from channel region 206 and presenting a conduction band discontinuity with the material of the floating gate. For an embodiment, gate oxide layer 214 is silicon dioxide. For another embodiment, gate oxide layer 214 is silicon nitride. For an embodiment, gate oxide layer 214 includes silicon oxynitride.

Similar to the case of the storage element 100 of FIG. 1, the thicknesses of the various components of flash cell 200 depends on the scaling requirements of the device technology so that the entire gate structure of the flash cell permits induction of charges from the substrate through the gate oxide.

Referring still to FIG. 2, an integrated circuit 280 is shown including an interconnection system 290 which comprises a flash cell 200 according to an embodiment. Interconnection system 290 may include a stack comprising several interconnect layers 262 separated by respective layers of dielectric material 264 which may be for example include silicon dioxide, spin-on glass, polyimide, diamond-like carbon etc. The stack may for example be formed using a CMOS, PMOS, or NMOS back-end-of-line process, and each of the layers within the stack may include one or more layers. Some of vias 236 electrically connect to contacts 240 for the substrate 202. A further contact 242 (shown in broken lines as, in the shown embodiment, it resides in a different cross sectional plane than the one shown in FIG. 2, provides electrical connection to control gate 204.

FIGS. 3-6 show plots of the bandgap energies versus distance of an embodiment of a non-volatile storage element 300 such as the storage element of FIG. 1 or FIG. 2 in respective bias modes. Thus, in FIGS. 3-6, the x-axis corresponds to distance in nm, where the differentially shaded bands or blocks correspond to respective thicknesses for dielectrics of a storage element according to one embodiment, and where the y-axis corresponds to bandgap energy in eV. In the shown embodiment of storage element 300, the first dielectric 308 includes a 1.3 nm thick layer of a high-k material, such as hafnium oxide, the second dielectric 310 comprises a 2 nm thick layer of a dielectric, such as silicon dioxide, and the third dielectric layer 314 comprises a 1 nm thick layer of a dielectric, such as silicon dioxide. The first electrode 302 comprises, for example, platinum, and the second electrode 304 may comprise titanium.

It is to be understood that the bandgap energy plots of FIGS. 3-6 correspond to one embodiment, and that other thicknesses, materials and respective bandgap differences are within the purview of embodiments. It is further to be understood that the bandgap energy plots of FIGS. 3-6 are not necessarily representative of bandgap differentials as between the different components that could result, but are merely schematic depictions of what could happen to such bandgaps according to one embodiment, regardless of the specific upper and lower energy values of each bandgap. FIGS. 3-6 will be described in detail below.

Figure 3:
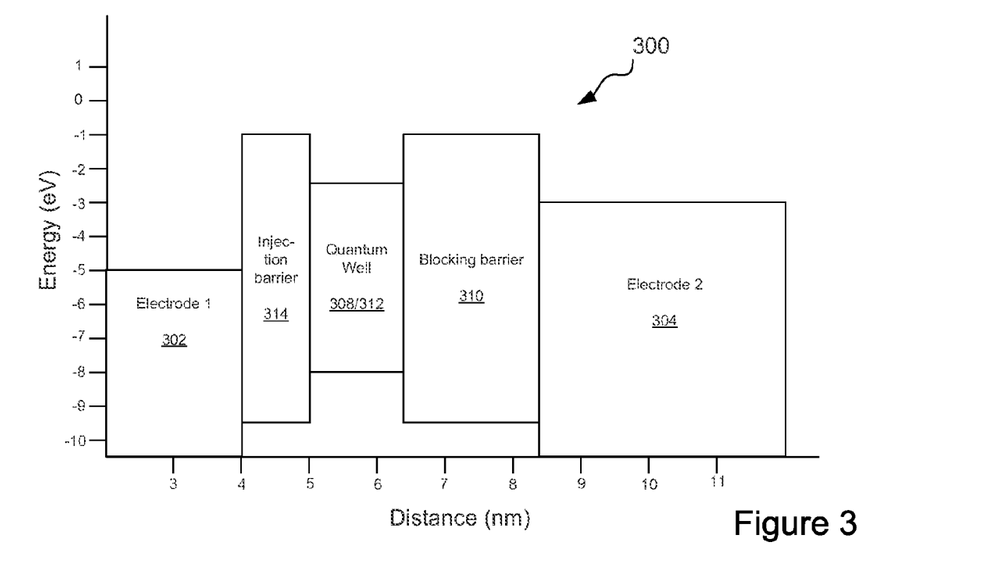
FIGS. 3-6 are plots showing bandgap energy plotted against distance for an embodiment of a non-volatile storage element in flatband alignment, at zero bias, during a write operation, and during an erase operation, respectively.

Referring first to FIG. 3, a bandgap energy plot is shown of the storage element 300 in flatband alignment mode.

Figure 4:
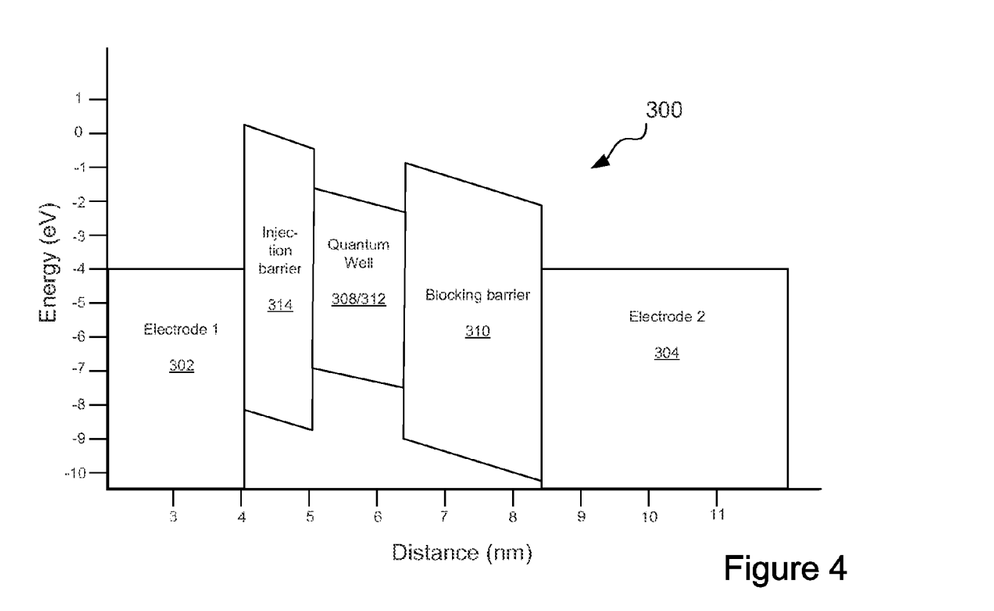

Referring next to FIG. 4, a bandgap energy plot is provided of the storage element 300 in an off-state, that is, in a data retention stage where there is zero bias between the first electrode 302 and the second electrode 304. In the off-state, Fermi levels the first electrode 302 and of the second electrode 304 are aligned/equal. As a result, there is a tilt in the energy band that is shown as having resulted for the first dielectric 308 toward the second electrode 304, which tilt pushes stored electrons near the thicker retaining barrier provided by the second dielectric 310. The alignment of the Fermi levels is a result of the lowest energy state. By default, the Fermi levels will align at zero bias because that is the lowest energy of the system. The provision of the thicker second dielectric 310, along with the tilting brought about a as a result of the alignment of the Fermi levels as between the first electrode 302 and the second electrode 304, results in a substantial prevention of electrode tunneling of the stored charges toward either the second or the third dielectric, in this way ensuring a reliable data storage at zero bias. The tilting is brought about by a selection of the work-function material, such as metal, for each electrode.

Figure 5:
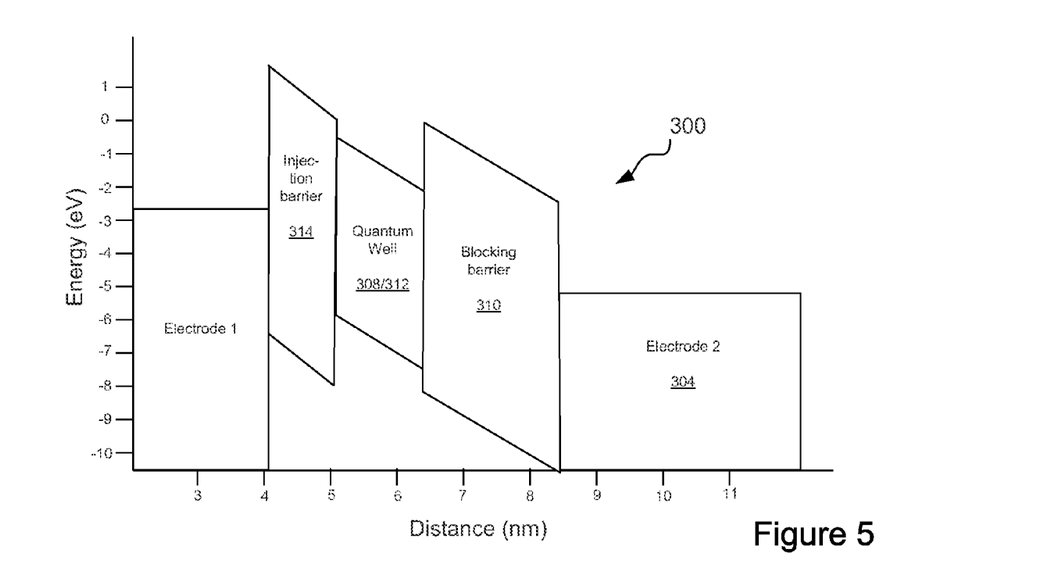

Referring next to FIG. 5, a bandgap energy plot is shown for the storage element 300 during a write operation, that is, during a time when there is a negative bias between the first electrode 302 and the second electrode 304 as shown, by virtue of a negative voltage having been applied to first electrode 302. In FIG. 5, data is shown in the process of being written into the first dielectric 308 by way of electron tunneling (either direct or Fowler-Nordheim) into quantum well 312 through the injecting barrier provided by the third dielectric 314. During the write operation, the retaining barrier in the form of second dielectric 310 has a negligible tunneling rate as compared with the injecting barrier in the form of first dielectric 108. As a result, charge builds up in the quantum well 312. If the voltage of the first electrode 302 were thereafter lowered to zero, the storage element 306 would then revert back to the state mentioned with respect to FIG. 4.

As seen in FIG. 5, the degree of tilt of the energy bands toward the retaining barrier is more pronounced during a write operation as compared with the off-state of the storage element. This is because, by virtue of the negative bias between the first electrode and the second electrode, and because of the higher work-function of the second electrode as compared with the first electrode, a Fermi level misalignment between the first and second electrodes becomes even more pronounced, resulting in the more pronounced tilt. The applied voltage between the electrodes is what causes the Fermi levels to separate, and the tilt is a result of the electric field that is induced from the voltage across the barriers.

Figure 6:
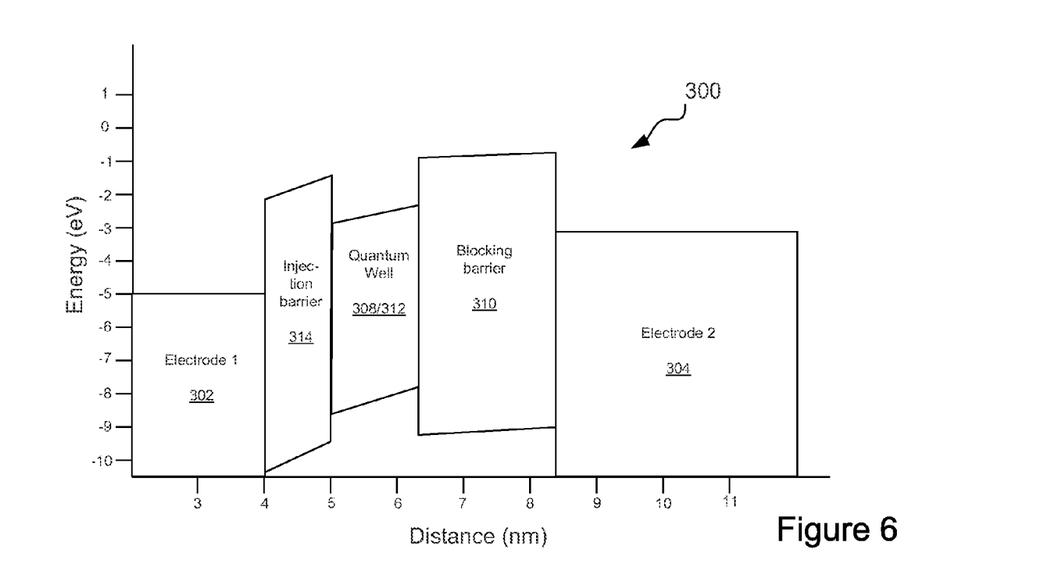

Referring next to FIG. 6, a bandgap energy plot is shown for storage elements 300 during an erase operation, that is, during a time when there is a positive bias between the first electrode 302 and the second electrode 304. The positive bias may be brought about by applying a positive voltage to the first electrode 302 while the voltage at the second electrode is at zero. In FIG. 6, data is shown in the process of being erased from the first dielectric 308 by way of electron tunneling (direct or Fowler-Nordheim) out of quantum well 312 through the injecting barrier provided by the third dielectric 314. During the erase operation, the much thinner injecting barrier allows the possibility of a lower voltage erase than would have been required has the barrier dielectric to retain charges corresponded to the same barrier dielectric to write and erase charges. As a result, charge is removed from the quantum well 312. As further seen in FIG. 6, a tilt occurs toward the injecting barrier by virtue of the positive bias between the first electrode and the second electrode, and because of the higher work-function of the second electrode as compared with the first electrode. The erase operation rests the state of the storage element, such that at zero voltage with zero charge storage, the flat band alignment configuration shown in FIG. 1 may result.

Figure 7:
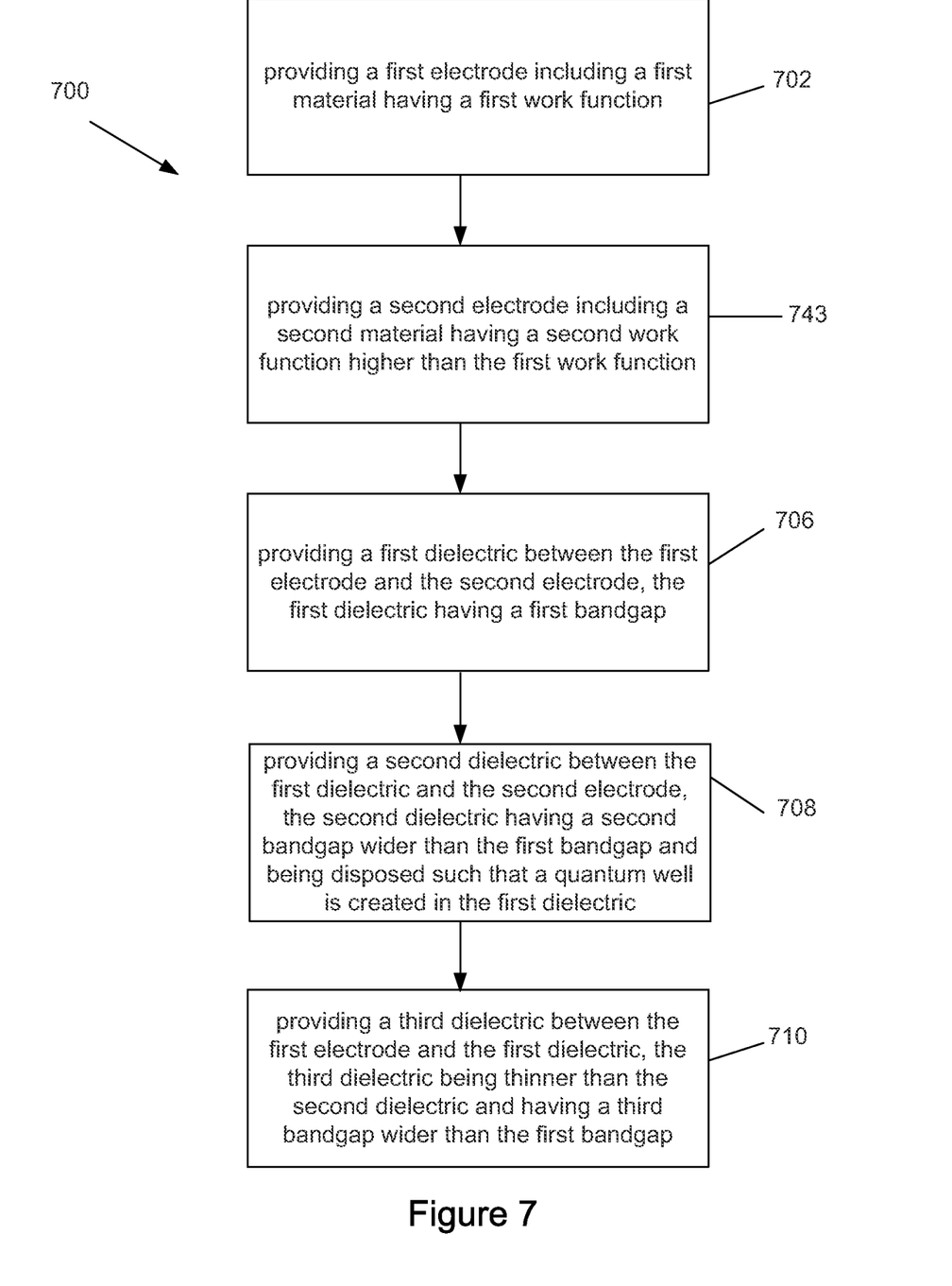
FIG. 7 is a flow diagram of a method embodiment.

Referring next to FIG. 7, a flowchart for a method embodiment 700 is shown. At block 702, the method includes providing a first electrode including a first material having a first work function. At block 704, the method further includes providing a second electrode including a second material having a second work function higher than the first work function, and at block 706 providing a first dielectric between the first electrode and the second electrode, the first dielectric having a first bandgap. The method at block 708 includes providing a second dielectric between the first dielectric and the second electrode, the second dielectric having a second bandgap wider than the first bandgap and being disposed such that a quantum well is created in the first dielectric. Finally, at block 710, the method includes providing a third dielectric disposed between the first electrode and the first dielectric, the third dielectric being thinner than the second dielectric and having a third bandgap wider than the first bandgap.

Advantageously, according to embodiments, an implementation of dual work-function electrodes may be used to create non-volatile storage elements including a quantum well to store injected charge therein. The electrodes sandwiching the dielectric stack may be specifically chosen to have differing work functions in order to tune the band alignment of the storage element to enable easier programming and erasing in an on-state of the element, and better charge retention in an off-state of the element. Advantageously, a dielectric stack that juxtaposes two dielectric materials presenting a conduction band discontinuity therebetween allows the creation of a quantum well in the lower bandgap dielectric, in this way promoting the storage of charges within the quantum well. The quantum well structure, when combined with the use of dual work-function electrodes on either side of the dielectric stack may result in the creation of a tilt of the quantum well conduction band that ensures data retention at zero bias. The higher bandgap dielectric may serve as a barrier to electron lead and may promote electron retention and allow more effective write operations. In addition, the tuning capability afforded by the dual work-function electrodes allows for a thin third dielectric may be provided between the first electrode and the second dielectric in order to facilitate write and erase operations. Another advantage of an embodiment encompassing a SiO2/high-k/SiO2 stack as part of the storage element is that it does away with the use of polysilicon in the material stack, and embraces the high-k/metal gate state of the art process technologies, thereby rendering previous incarnations of polysilicon-based memory element incompatible with the CMOS process flow. Also, embodiments are compatible and can be integrated with the current SOC (system on a chip) and CPU process technologies. In addition, the scalability of the storage element may be matched as a result to a technology minimum gate patterning capability.

The foregoing description is intended to be illustrative and not limiting. Variations will occur to those of skill in the art. Those variations are intended to be included in the various embodiments of the invention, which are limited only by the scope of the following claims.

What is claimed is:

1. A non-volatile storage element comprising:
a first electrode including a first material having a first work function;
a second electrode including a second material having a second work function higher than the first work function;
a first dielectric disposed between the first electrode and the second electrode, the first dielectric having a first bandgap;
a second dielectric disposed between the first dielectric and the second electrode, the second dielectric having a second bandgap wider than the first bandgap and being disposed such that a quantum well is created in the first dielectric; and
a third dielectric disposed between the first electrode and the first dielectric, the third dielectric being thinner than the second dielectric and having a third bandgap wider than the first bandgap;
wherein the first electrode, second electrode, first dielectric and second dielectric are configured such that, at zero bias between the first electrode and the second electrode, a tilt results in conduction bands for each of the first dielectric, the second dielectric, and the third dielectric in a direction downwards toward the second electrode, and a storing of electrons takes place in the quantum well.

2. The storage element of claim 1, wherein the first dielectric and the third dielectric include one of silicon dioxide, silicon nitride and silicon oxynitride.

3. The storage element of claim 1, wherein at least one of the first dielectric and the second dielectric includes a high-k material.

4. The storage element of claim 1, wherein the first dielectric is between about 1 nm and about 15 nm, the second dielectric is between about 0.5 nm and about 10 nm, and the third dielectric is between about 0.5 nm and 2 nm.

5. The storage element of claim 1, wherein the first electrode, second electrode, first dielectric, second dielectric and third dielectric are configured such that, at a negative bias between the first electrode and the second electrode, a tilt results in conduction bands of the first dielectric, second dielectric and third dielectric in a direction downwards toward the second electrode, and a tunneling of electrons takes place into the quantum well from the first electrode.

6. The storage element of claim 1, wherein the first electrode, second electrode, first dielectric, second dielectric and third dielectric are configured such that, at a positive bias between the first electrode and the second electrode, a tilt results in conduction bands of the first dielectric, second dielectric and third dielectric in a direction downwards toward the first electrode, and a tunneling of electrons takes place from the quantum well to the first electrode.

7. A method of making a storage element comprising:
providing a first electrode including a first material having a first work function;
providing a second electrode including a second material having a second work function higher than the first work function;
providing a first dielectric between the first electrode and the second electrode, the first dielectric having a first bandgap;
providing a second dielectric between the first dielectric and the second electrode, the second dielectric having a second bandgap wider than the first bandgap and being disposed such that a quantum well is created in the first dielectric;
providing a third dielectric between the first electrode and the first dielectric, the third dielectric being thinner than the second dielectric and having a third bandgap wider than the first bandgap; and
configuring the first electrode, second electrode, first dielectric, second dielectric and third dielectric such that, at zero bias between the first electrode and the second electrode, a tilt results in conduction bands of the first dielectric, the second dielectric, and the third dielectric in a direction downwards toward the second electrode, and a storing of electrons takes place in the quantum well.

8. The method of claim 7, wherein the first dielectric and the third dielectric include one of silicon dioxide, silicon nitride and silicon oxynitride.

9. The method of claim 7, wherein at least one of the first dielectric and the second dielectric includes a high-k material.

10. The method of claim 7, wherein the first dielectric is between about 1 nm and about 15 nm, the second dielectric is between about 0.5 nm and about 10 nm, and the third dielectric is between about 0.5 nm and 2 nm.

11. The method of claim 7, further comprising configuring the first electrode, second electrode, first dielectric, second dielectric and third dielectric such that, at a negative bias between the first electrode and the second electrode, a tilt results in conduction bands of the first dielectric, second dielectric and third dielectric in a direction downwards toward the second electrode, and a tunneling of electrons takes place into the quantum well from the first electrode.

12. The method of claim 7, further comprising configuring the first electrode, second electrode, first dielectric, second dielectric and third dielectric such that, at a positive bias between the first electrode and the second electrode, a tilt results in conduction bands of the first dielectric, second dielectric and third dielectric in a direction downwards toward the first electrode, and a tunneling of electrons takes place from the quantum well to the first electrode.

13. An integrated circuit including:
a storage element comprising:
  a first electrode including a first material having a first work function;
  a second electrode including a second material having a second work function higher than the first work function;
  a first dielectric disposed between the first electrode and the second electrode, the first dielectric having a first bandgap;
  a second dielectric disposed between the first dielectric and the second electrode, the second dielectric having a second bandgap wider than the first bandgap and being disposed such that a quantum well is created in the first dielectric; and
  a third dielectric disposed between the first electrode and the first dielectric, the third dielectric being thinner than the second dielectric and having a third bandgap wider than the first bandgap; and
  a stack including interconnect layers, interlayer dielectric layers interleaved with the interconnect layers, and vias extending into the interlayer dielectric layers, the stack comprising a first via of the vias connected to the first electrode, and a second via of the vias connected to the second electrode;
wherein the first electrode, second electrode, first dielectric and second dielectric are configured such that, at zero bias between the first electrode and the second electrode, a tilt results in conduction bands for each of the first dielectric, the second dielectric, and the third dielectric in a direction downwards toward the second electrode, and a storing of electrons takes place in the quantum well.

14. The integrated circuit of claim 13, wherein the first dielectric and the third dielectric include one of silicon dioxide, silicon nitride and silicon oxynitride.

15. The integrated circuit of claim 13, wherein at least one of the first dielectric and the second dielectric includes a high-k material.

* * * * *